US007202178B2

(12) United States Patent
Krawczyk et al.

(10) Patent No.: US 7,202,178 B2

(45) Date of Patent: Apr. 10, 2007

(54) MICRO-FLUID EJECTION HEAD CONTAINING REENTRANT FLUID FEED SLOTS

(75) Inventors: John W. Krawczyk, Richmond, KY (US); Andrew L. McNees, Lexington, KY (US); Richard L. Warner, Lexington, KY (US)

(73) Assignee: Lexmark International, Inc., Lexington, KY (US)

(*) Notice: Subject to any disclaimer, the term of this patent is extended or adjusted under 35 U.S.C. 154(b) by 188 days.

(21) Appl. No.: 11/002,453

(22) Filed: Dec. 1, 2004

(65) Prior Publication Data

US 2006/0113277 A1 Jun. 1, 2006

(51) Int. Cl.
*H01L 21/302* (2006.01)

(52) U.S. Cl. ...................... 438/712; 438/713; 438/714; 438/719

(58) Field of Classification Search ................ 438/712, 438/713, 714, 719
See application file for complete search history.

(56) References Cited

U.S. PATENT DOCUMENTS

| | | | | |
|---|---|---|---|---|
| 5,611,888 | A | 3/1997 | Bosch et al. | |
| 5,626,716 | A | 5/1997 | Bosch et al. | |
| 6,191,043 | B1 | 2/2001 | McReynolds | |
| 6,261,962 | B1 * | 7/2001 | Bhardwaj et al. | 438/702 |
| 6,303,513 | B1 | 10/2001 | Khan et al. | |
| 6,342,430 | B1 | 1/2002 | Adams et al. | |
| 6,402,301 | B1 | 6/2002 | Powers et al. | |
| 6,555,480 | B2 | 4/2003 | Milligan et al. | |
| 6,643,075 | B2 | 11/2003 | Wang et al. | |
| 6,712,983 | B2 | 3/2004 | Zhao et al. | |
| 7,074,723 | B2 * | 7/2006 | Chinn et al. | 438/714 |
| 2003/0186545 | A1 | 10/2003 | Kamp et al. | |
| 2003/0232505 | A1 | 12/2003 | Lazar et al. | |
| 2004/0124494 | A1 * | 7/2004 | Ciovacco et al. | 257/510 |
| 2004/0198063 | A1 * | 10/2004 | Subramanian et al. | 438/712 |
| 2004/0209486 | A1 * | 10/2004 | Naeem et al. | 438/786 |
| 2005/0070117 | A1 * | 3/2005 | Jacobs et al. | 438/710 |

* cited by examiner

*Primary Examiner*—Nadine G. Norton
*Assistant Examiner*—Binh X. Tran
(74) *Attorney, Agent, or Firm*—Luedeka, Neely & Graham

(57) ABSTRACT

A method of micro-machining a semiconductor substrate to form through slots therein and substrates made by the method. The method includes providing a dry etching chamber having a platen for holding a semiconductor substrate. During an etching cycle of a dry etch process for the semiconductor substrate, a source power is decreased, a chamber pressure is decreased from a first pressure to a second pressure, and a platen power is increased from a first power to a second power. Through slots in the substrate provided by the method can have a reentrant profile for fluid flow therethrough.

16 Claims, 7 Drawing Sheets

MICRO-FLUID EJECTION HEAD CONTAINING REENTRANT FLUID FEED SLOTS

CROSS-REFERENCE TO RELATED APPLICATIONS

This application is related to subject matter also disclosed in commonly assigned U.S. patent application Ser. No. 11/001,227, filed Dec. 1, 2004, entitled "A Micro-Fluid Ejection Head Containing Reentrant Fluid Feed Slots", naming Krawczyk et al. as inventors, which has been co-filed with the present application on even date herewith.

FIELD OF THE DISCLOSURE

The disclosure relates to micro-fluid ejection heads and in particular to micro-fluid ejection heads containing reentrant fluid feed slots and methods of making the micro-fluid ejection heads.

BACKGROUND AND SUMMARY

With the advent of a deep reactive ion etching (DRIE) process for forming slots and trenches in a semiconductor substrate, greater precision and control over the etching of silicon substrates in higher speed processes has been obtained. DRIE is a dry etching process carried out under high vacuum by means of a chemically reactive plasma, wherein the constituents of the plasma are selected in congruence with the substrate to be acted upon. Before the adoption of DRIE techniques to form trenches or slots in semiconductor substrates, most trenches or slots in substrates greater than about 200 microns thick were formed by mechanical blasting techniques or chemical wet etching techniques. However, such mechanical techniques or chemical wet etching techniques are not suitable for newer products which demand higher tolerances and smaller trenches and/or slots. DRIE enables deep anisotropic etching of trenches and slots with greater tolerances and without regard to crystal orientation.

DRIE techniques have progressed incrementally towards a goal of etching high aspect ratio features in semiconductor substrates wherein the aspect ratio is on the order of 1:100 width to depth. Hence, much progress has been made in forming vertical conduits or trenches with substantially perpendicular walls. The process scheme for achieving high aspect ratio slots or trenches in semiconductor substrates includes a series of sequential steps of alternating etching and passivation. Such aniosotropic etching techniques are described in U.S. Pat. Nos. 5,611,888 and 5,626,716 to Bosch et al. the disclosures of which are incorporated herein by reference.

A schematic diagram of a DRIE system 10 is illustrated in FIG. 1. The system 10 includes a ceramic reaction chamber 12 and a radio frequency (rf) unit 14 for providing source power to a coil 16 to generate a plasma in the reaction chamber 12. A wafer 18 containing a plurality of semiconductor substrates is disposed in the chamber 12 on a cooled chuck which is part of platen 20. The temperature of the platen/chuck 20, and thus the wafer 18, is selected on a chiller unit 22 providing helium gas to the platen/chuck 20. A platen power unit 24 provides rf biasing power to the platen 20 during the etching process. The chamber 12 is maintained at a low pressure during etching by a vacuum pumping unit coupled to a vacuum port 26. A reactive gas is introduced into the chamber through a gas inlet port 28. A bellows system 30 may be provided to adjust a height of the platen 20 before the etching process.

Accordingly, most dry etching systems 10 are designed to etch substantially vertical wall slots and trenches in the substrate 18, i.e., walls that are substantially perpendicular to a surface of the substrate 18. However, for micro-fluid ejection heads, it has been found that substantially vertical walls may entrap more air in fluids passing through relatively narrow slots. Such air entrapment can lead to fluid starvation for ejection devices on a device surface of the substrate. Accordingly, there is a need for improved DRIE techniques to form fluid feed slots having reentrant walls in micro-fluid ejection head substrates.

With regard to the foregoing, there is provided a method of micro-machining a semiconductor substrate to form through slots therein and substrates made by the method. The method includes providing a dry etching chamber having a platen for holding a semiconductor substrate. During an etching cycle of a dry etch process for the semiconductor substrate, a source power is decreased, a chamber pressure is decreased from a first pressure to a second pressure, and a platen power is increased from a first power to a second power. Through slots in the substrate provided by the method have a reentrant profile for fluid flow therethrough.

In another embodiment there is provided a deep reactive ion etching process for etching a semiconductor substrate to form one or more reentrant fluid feed slots therein. The process includes decreasing a source power from during etching cycle steps of the etching process, decreasing a chamber pressure from a first pressure to a second pressure during etching cycle steps of the etching process, and increasing a platen power from a first power to a second power during etching cycle steps of the process.

An advantage of the exemplary process disclosed herein can include providing precisely formed slots having a reentrant profile without significantly reducing a production rate for micro-machining semiconductor substrates. For example, production rates may be maintained by ramping the powers and pressure during the etching cycles of the process rather than maintaining constant powers and pressure throughout the process. The exemplary process can also enable the formation of slots having reentrant profiles with reduced top side damage. Despite a reduction in chamber pressure and a decrease in source power during the etching cycles of the process, the process can yield superior reentrant slot profiles, which is believed to be contrary to conventional thinking with regard to such processes.

BRIEF DESCRIPTION OF THE DRAWINGS

Further advantages of the embodiments will become apparent by reference to the detailed description of exemplary embodiments when considered in conjunction with the drawings, wherein like reference characters designate like or similar elements throughout the several drawings as follows.

DETAILED DESCRIPTION OF EXEMPLARY EMBODIMENTS

Figure 1:
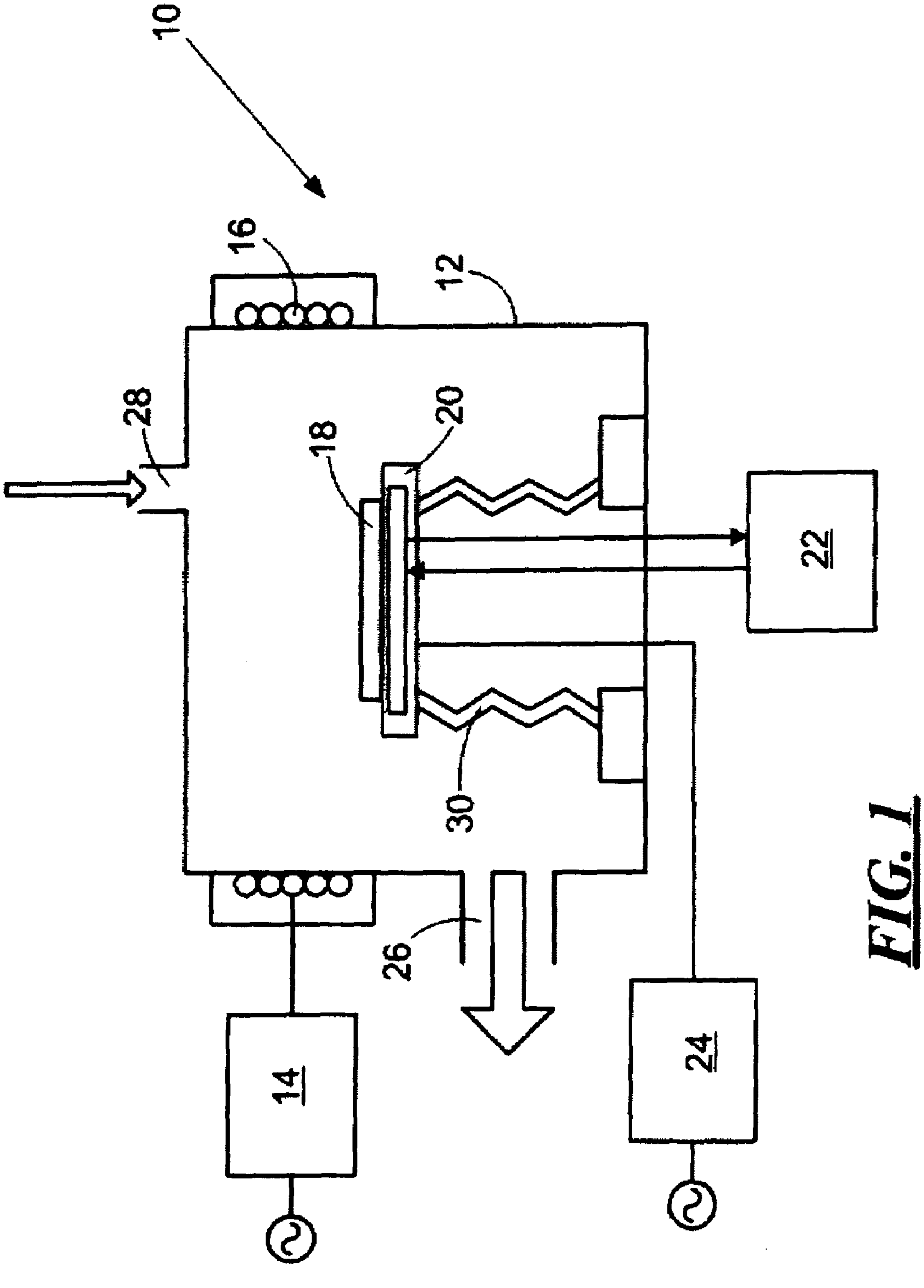
FIG. 1 is a schematic diagram of a deep reactive ion etching system.

With reference again to FIG. 1, the system 10, otherwise known as an inductively coupled plasma (ICP) system provides electromagnetic energy to gaseous species within the chamber 12 by applying power to the rf coil 16 wrapped around a dielectric portion of the chamber 12. As current oscillates in the coil 16 very little power dissipation is realized prior to plasma ignition resulting in an ever increasing floating potential difference across the coil 16. The potential difference across the coil 16 provides capacitive coupling of the coil to the dielectric portion of the chamber 12 resulting in an electric field. Eventually the floating potential difference reaches a threshold limit. At the threshold limit, voltage breakdown occurs rendering an ionic mixture including radicals, electrons and emitted photons from a previously neutral gas. The ionic mixture is a luminescent gas generally called a plasma.

Any gas, under the right conditions will form a plasma. However gases used in etching or deposition are chosen strategically to affect particular substrates in a prescribed manner. For example, silicon etching is primarily accomplished in the presence of fluorine or fluorine evolving gases such as sulfur hexafluoride ($SF_6$). Sulfur hexafluoride undergoes ionization according to the following reaction:

$$SF_6+e^- \rightarrow S_xF_y^+ + S_xF_y^* + F^* + e^- \quad (1)$$

thereby producing the reactive fluorine radicals which react with silicon according to the following reaction:

$$Si+F^* \rightarrow SiF_x \quad (2)$$

to produce a volatile gas. A reaction of the fluorine radicals with silicon isotropically etches the silicon.

Figure 2A:
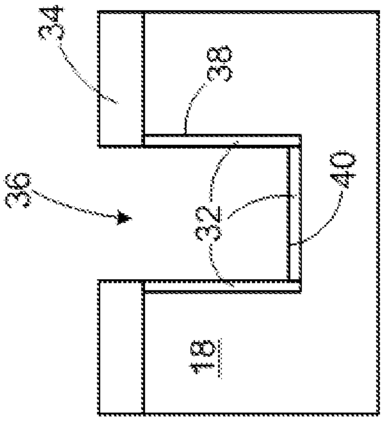
FIG. 2A PRIOR ART
FIGS. 2A–2C are schematic diagrams of a dry etching process using conventional approaches.
Figure 2B:
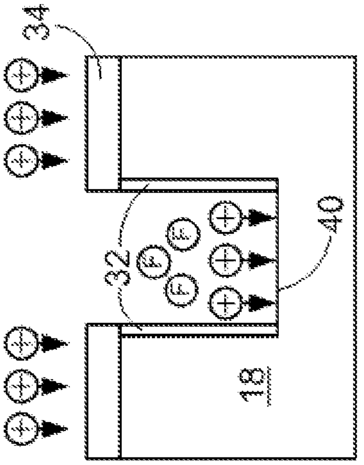
FIG. 2B PRIOR ART
Figure 2C:
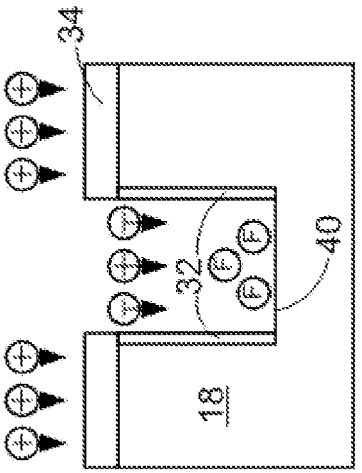
FIG. 2C PRIOR ART

Isotropic etching, however, is geometrically limited. To produce high aspect ratio features in a silicon substrate with predominantly vertical walls a directional or anisotropic etch is required. In order to produce vertical walls, a deep reactive ion etching (DRIE) process is used. The DRIE process includes alternating etching and passivating cycles as shown in FIGS. 2A–2C wherein a fluorocarbon polymer ($nCF_2$) is generated to provide a passivating layer 32 during the passivating cycles of the process. Cycling times for each step preferably range from about 3 to about 20 seconds. The fluorocarbon polymer is derived from a compound such as octofluorobutane ($C_4F_8$) according to the following reactions:

$$C_4F_8+e^- \rightarrow CF_x^* + CF_x^* + F^* + e^- CF_x^* \rightarrow nCF_2 \quad (3)$$

Prior to etching a substrate 18, a mask 34 (FIGS. 2A–2C) is applied to the substrate or wafer 18 to provide a location for fluid feed slots 36 in the wafer 18. A process for etching a silicon substrate 18 to form the fluid feed slots 36 therein is described in U.S. Pat. No. 6,402,301 to Powers et al., the disclosure of which is incorporated herein by reference.

During a passivating step of the process, a $C_4F_8$ gas is introduced into the chamber 12 and a plasma is generated under conditions that enable the fluorocarbon polymer to condense on exposed surfaces of the substrate 18 including on side wall surfaces 38 and bottom surface 40 to provide the passivation layer 32 (FIG. 2A). Substantially immediately following the passivating step, the $C_4F_8$ is evacuated from the chamber 12 and replaced with a reactive etching gas $SF_6$ which forms a reactive plasma under the influence of new, and often radically, different operating conditions (FIG. 2B). As a rule of thumb, for instance, little or no power is applied to the platen 20 during the passivating step as the general intent during this step is to promote condensation of the fluorocarbon polymer uniformly on the side wall surfaces 38 and bottom surface 40 of the substrate 18. Increasing the platen power may reduce condensation of the fluorocarbon polymer on the bottom surface 40 and/or the side wall surface 38 of the substrate 18.

During the etching step the platen power is increased to promote removal of passivation species from the bottom surface 40 of the forming slot 36. Ions or charged species are influenced by electromagnetic fields with their trajectories tangentially directed along field lines. Because the pertinent field lines are substantially perpendicular to the bottom surface 40 of the developing slots 36, and because passivation removal is generally a line of sight phenomena with areas perpendicular to the side walls 38 receiving a disproportionate share of the ionic bombardment, passivation is removed from the bottom surface 40 of the slot 36 at a much higher rate than from the side walls 38. As a result, the etch rate of the bottom surface 40 is significantly higher than the passivated side walls surfaces 38.

While fluorocarbon polymerization during passivation and disproportionate ionic bombardment at the bottom surface 40 of the slot 36 result in etch directionality, it is the fluorine radical that is responsible for the actual etching of the substrate 18 (FIG. 2C). Radicals species are naturally evolved in plasma chemistries produced in accordance with equation (1) and, in contrast to ions, are typically unaffected by electromagnetic fields with their propagation to the substrate surface 40 driven purely by diffusion. Upon arriving at a bare surface 40 not protected by passivation, radicals spontaneously etch silicon according to equation (2). Therefore etch directionality is a consequence of strategically incomplete side wall passivation removal.

It will be appreciated that the result of each etching cycle is an isotropic etch of the substrate 18. However since the cycle time between the etching and passivating steps is kept relatively short the resulting fluid feed slot 36 has substantially vertical side walls 38 as illustrated by the substrate 18 in FIG. 3. Generally, the smaller the etch step to passivation step ratio and the shorter the overall individual process step cycle time, the more vertical will be the side walls 38 of the slot 36. However, this is an over-simplification of a very complex process. In actuality the geometry of slot 36 is a function of numerous parameters many of which vary non-linearly.

For example, etching may be conducted by setting values for the rf source power during etch, the rf source power during passivation, the rf platen power, often referred to as bias power, during etch, the rf platen power during passivation, gas flow rate, chamber pressure, etch to passivation time, cycle time, pressure during etch, pressure during passivation, platen temperature, electromagnetic current, z-height of the platen, and the like. Some or all of the above parameters may be ramped up or down simultaneously during the process. From this broad choice of operating parameters a multitude of plasmas with markedly different characteristics may be generated producing different geometries of the side walls 38 of the substrate 18.

Figure 3:
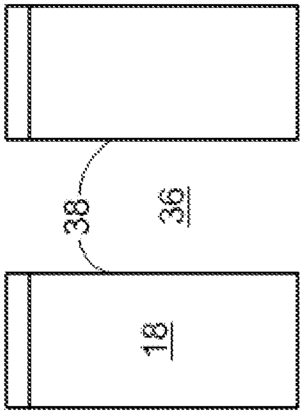
FIG. 3 PRIOR ART
FIG. 3 is a cross-sectional view, not to scale, of a slot made in a substrate by a dry etching process using conventional approaches.
Figure 4:
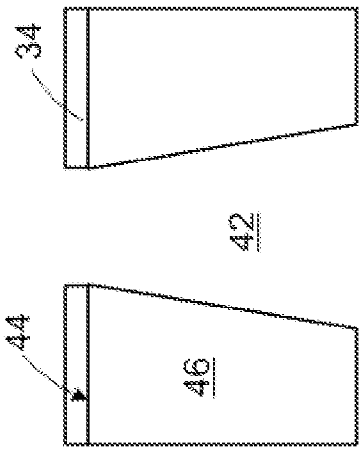
FIG. 4 is a cross-sectional view, not to scale, of a slot made in a substrate by a dry etching process according to embodiments of the disclosure.

However, etching reentrant slots 42 (FIG. 4) with tools designed to produce side walls 38 as shown in FIG. 3 becomes problematic in a situation where device side 44 dimensions and tolerances are rigidly set parameters that are necessary for proper device functionality. Etching from the device side 44 of a substrate 46 is conducted in order to precisely place the slot 42 in the substrate 46. However, as described in more detail below, device side 44 damage is more likely to occur when etching reentrant slots 42 as opposed to the vertical side wall slots 36.

As set forth above, conventional DRIE etch systems 10 are typically designed to produce vertical side wall 38 trenches or slots 36. However, for micro-fluid ejection head applications, vertical side walls 38 are less desirable for air bubble mobility through the slots 36. There is evidence that substantially vertical fluid slots 36 may cause inadequate fluid flow to ejection devices on a device surface 44 of the substrate 46.

Figure 5:
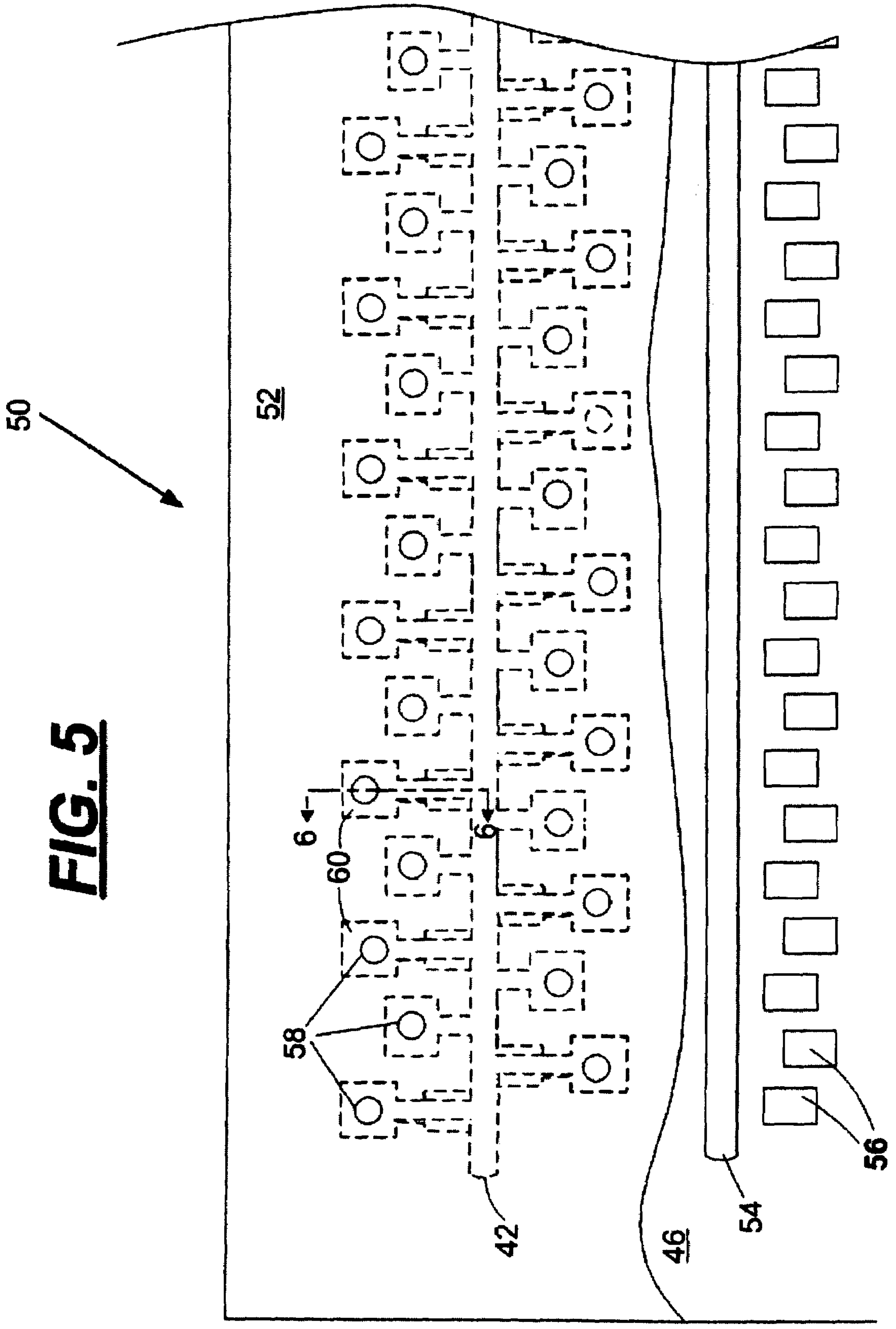
FIG. 5 is a plan view, not to scale, of a portion of a micro-fluid ejection head.

A plan view of a portion of a micro-fluid ejection head 50 is illustrated in FIG. 5. The ejection head 50 includes a substrate 46 and a nozzle plate 52 attached to the substrate. The substrate 46 may include a single fluid feed slot 42 or multiple fluid feed slots 42 and 54. A plurality of ejection devices, such as devices 56 are adjacent the slots 42 and 54. Upon activation of the ejection devices 56, fluid is ejected through the nozzle holes 58 in the nozzle plate 52.

Figure 6:
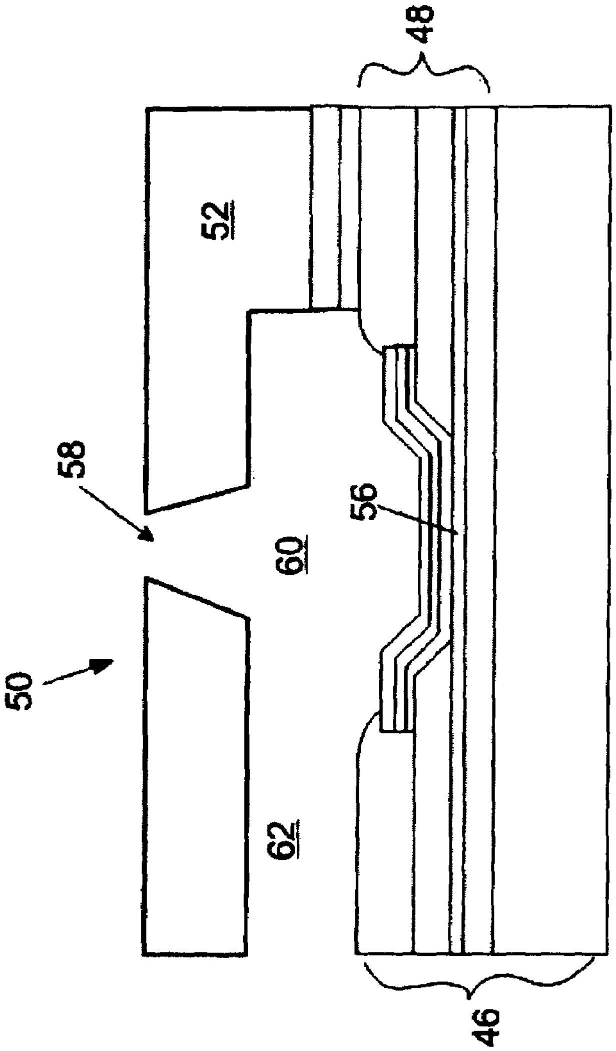
FIG. 6 is a cross-sectional view, not to scale, of a portion of the micro-fluid ejection head of FIG. 5.

A cross-sectional view, not to scale, of a portion of the micro-fluid ejection head 50 is illustrated in FIG. 6. The substrate 46 includes a plurality of layers 48 on the device side 44 thereof defining the plurality of ejection devices 56. The nozzle plate 52 includes nozzle holes 58, a fluid chamber 60 and a fluid channel 62, collectively referred to as flow features, in fluid flow communication with the slot 42 for providing fluid to the ejection devices 56. As the size of flow features in the micro-fluid ejection heads decreases, and the frequency of fluid ejection increases, adequate fluid supply to the ejection devices 56 becomes more critical. In order to assure adequate fluid is provided to the ejection devices 56, it is desirable to provide slots 42 having the reentrant profiles for the reasons described above.

Figure 7:
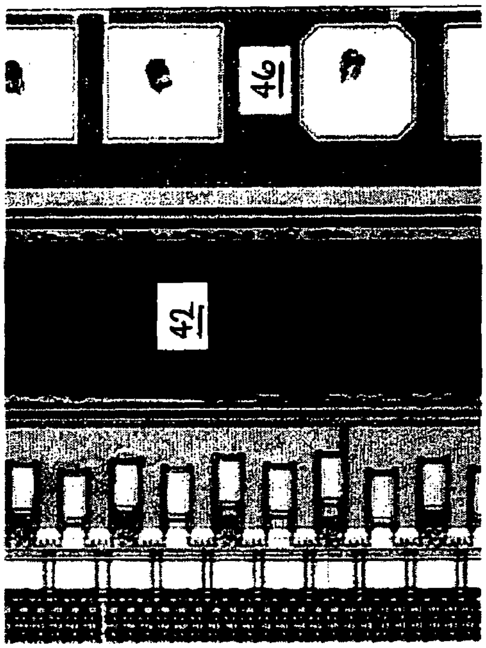
FIG. 7 is a photomicrograph of a device surface of a semiconductor substrate having a slot therein made by an alternative process.

Of the operating parameters that can be controlled during a DRIE process, the most influential for controlling slot profile appear to be chamber pressure, platen and source powers, platen temperature, distance between the substrate and the plasma source, and the etch to passivation cycle ratio. However, various combinations of some or all of the foregoing parameters have proved to be severely detrimental to overall cycle times, mask selectivity, mask removal post etch, device side 44 damage, or a combination thereof. For example, moving the wafer 18 closer to the plasma power source coil 16 can significantly reduce the silicon etch selectivity with respect to the etch mask 34, unacceptably increase the cycle time as much as two-fold, and reduce mask 34 removal efficiency. Likewise, a substrate temperature increase can also negatively impact the overall DRIE process in a similar manner with particularly egregious effects on mask 34 removal. Significant increases in etch to passivation ratio beyond certain limits can produce device surface 44 damage and reduce an ability to control the width or location of the slot 42. Detrimental effects of etching, such as device side damage, are illustrated in FIG. 7 by a photomicrograph of a device side of a substrate 18 made using a non-preferred process.

With respect to an ability to control device surface damage while providing reentrant fluid slots 42, the most influential parameters appear to be chamber pressure and platen power. For an exemplary DRIE system 10, it is preferred to control the platen power and chamber pressure independently for each of the etching and passivating steps of the process.

By way of further background, process schemes designed to maximize the etch rate for vertical walls typically use etch pressures and platen powers during the etching steps that are significantly higher than the pressure and powers during the passivating steps of the process. For example, substrates 18 with vertical side walls 38 having slots 36 etched therein at rates in excess of 12–15 microns per minute (with critical dimensions of few hundred microns in width and 10 or so millimeters in length) may use chamber pressures of about 150 milliTorr and platen powers of about 200 Watts for the etching steps of the process, and may use chamber pressures of about 25 milliTorr and platen powers of about 0.0 Watts for the passivating steps.

In an exemplary embodiment, in order to produce slots 42 having the more desirable reentrant profiles, variations of three to five of the key operational parameters can be selected. Particularly, variations can be made in the source power, platen power, chamber pressure, etch to passivation cycle ratio, and platen temperature in order to provide reentrant fluid feed slots 42.

Reentrancy in a DRIE process is a function of ion trajectory. Reentrancy occurs when a bottom portion 70 (FIG. 8) of the developing slot 42 is disproportionately more anisotropic than a top portion 72 of the slot 42. Disproportionate etching of the slot 42 is accomplished primarily by increasing the kinetic energy of ions bombarding the substrate 46 near the bottom portion 70 of the slot 42. According to an exemplary embodiment, the most efficient way to increase ion impact energy is by increasing the platen power in relation to the source power for the plasma. As the platen power is increased and the source power is decreased, the ion velocity and hence the kinetic energy of ions bombarding the bottom portion 70 of the slot 42 is increased.

Another factor effecting ion energy is a combination of reducing etch pressure and source power as the etch process progresses. Reducing the source power and decreasing the pressure in the chamber during the etch cycle is believed to be counter to conventional wisdom on how to achieve reentrant profiles.

Lowering the pressure and power simultaneously reduces the number of inelastic energy exchanges leading to a reduction in ionization, disassociation, etc. Nevertheless, fewer ionized species (due to the decrease in source power) and fewer species overall (due to the decrease in pressure) result in an increased combination of plasma constituent kinetic energy and mean free path. The “mean free path” is an average distance a species travels between collisions. As the density (pressure) of the etching gas is reduced, the mean free path between ionized species is increased. When the mean free path is large, atoms (molecules, sub-atomic species) can achieve significantly larger velocities. Furthermore, because the energy required to ionize a species is quantitized with a threshold below which ionization does not occur, and additions to kinetic energy occur within a continuum, energy of motion can accumulate and increase over numerous etching cycles when ionization occurs at a reduced rate.

Figure 9:
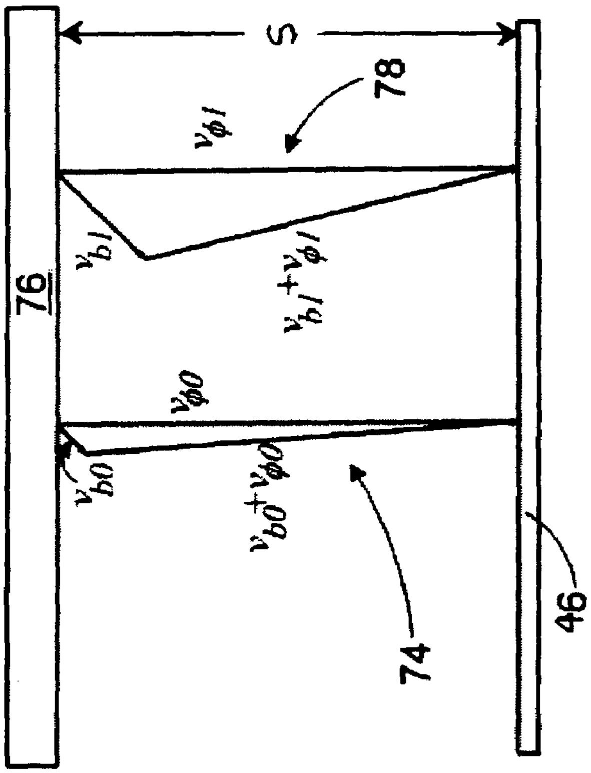
FIG. 9 is a vector diagram comparing a prior art etching process with an etching process according to the disclosure.

Without desiring to be bound by theory, an effect of increasing ion velocity within the bulk plasma has the effect of increasing a vector portion of the off vertical components of the ion path which combined with the reduced source power result in a more angled ion trajectory ($v_{b1}+v_{\Phi 1}$) as shown in FIG. 9 where $v_b$ is a bulk plasma velocity and $v_{\Phi 1}$ is a velocity acquired by the potential difference between the bulk plasma 76 and the substrate 46 (the distance therebetween can be referred to as the sheath). Vectors 74 produced by plasma 76 have a smaller bulk plasma velocity $v_{b0}$ with respect to a velocity $v_{\Phi 0}$ provided by the potential drop across the sheath and hence have a more vertical ion trajectory ($v_{b0}+v_{\Phi 0}$). By decreasing the pressure and increasing the platen bias, vectors 78 are produced wherein the bulk plasma velocity $v_{b1}$ is significantly greater than the bulk plasma velocity $v_{b0}$. The fact that the ion trajectory in the vector 78 has a higher bulk plasma velocity $v_{b1}$ is believed to be considered generally undesirable in the industry. However, for etching slots 42 having reentrant profiles, increasing the angled ion trajectory provides controlled side wall damage desirable to producing the reentrant profiles.

Figure 8:
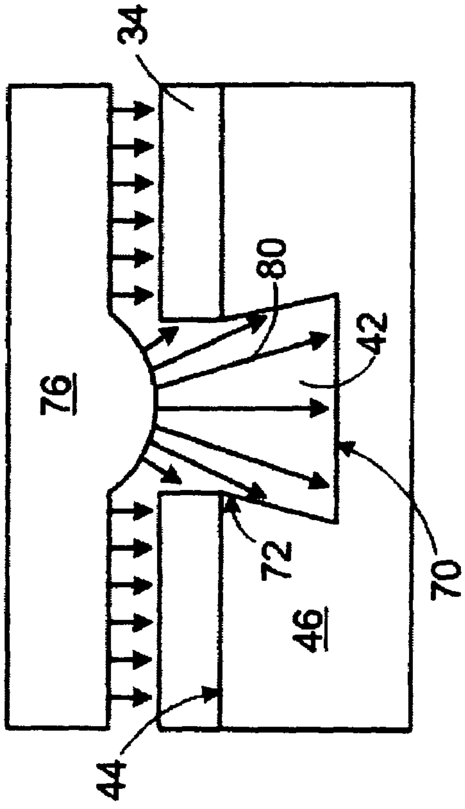
FIG. 8 is a schematic diagram of an etching process according to an embodiment of the disclosure.

The potential difference between the platen and the plasma 76 has an effect on the thickness of the sheath S above the substrate 46 (FIG. 8). The sheath thickness S and its shape above the substrate can be an important factor influencing ion trajectories. If the sheath is thin enough it can be distorted to mirror the surface 44 to which it is coupled resulting in lines of potential no longer parallel to the surface 44 . If the lines of potential are no longer parallel to the surface 44, E-field lines 80 will no longer be substantially perpendicular to the surface 44 resulting in off perpendicular ion trajectories and an increase in the reentrancy profile of the slot 42.

In addition to selecting plasma parameters to increase and modify ion trajectories, two other factors affecting reentrancy profiles are platen or substrate temperature and etch step to passivation step ratio. The passivating step of the process is highly sensitive to the substrate temperature. Higher temperatures inhibit deposition of the fluorocarbon polymer on the side walls 38 (FIG. 2A) and thus result in an etch profile with lower anisotropy and greater reentrancy profile. Accordingly, increasing the platen temperature from about −19° C. to about 20° C. increases the reentrancy profile of the slot 42.

Also, the greater the etch step to passivation step ratio the greater the anisotropy of the etching process. However, conventionally, there is little to room to increase the etch to passivation ratio while maintaining an acceptable minimum of device side damage. A typical etch step to passivation step ratio is about 7:3.

The following table provides a comparison of the foregoing parameters according to embodiments of the disclosure compared to process parameters which convention would suggest to be effective to produce reentrant profiles. The various parameters were ramped up or down as indicated by the arrows during the etching process for producing slots 42 having reentrant profiles in a semiconductor substrate 46.

| Plasma Parameter | Embodiments of Disclosure | Processes Thought to be Effective to Produce Reentrancy |
|---|---|---|
| Source Power | ↓ | ↑ |
| Platen Power | ↑ | ↑ |
| Etch Pressure | ↓ | ↑ |
| Etch to Passivation Ratio | ↑ | ↑ |
| Substrate Temperature | ↑ | ↑ |

Figure 10C:
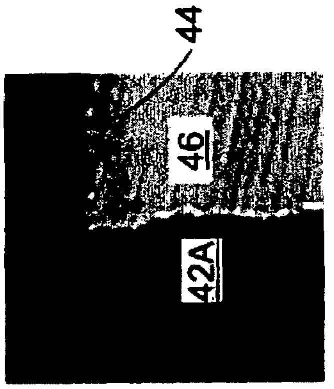
FIGS. 10A–10C are photomicrographs of a substrate containing a fluid feed slot made by an alternative process.
Figure 10B:
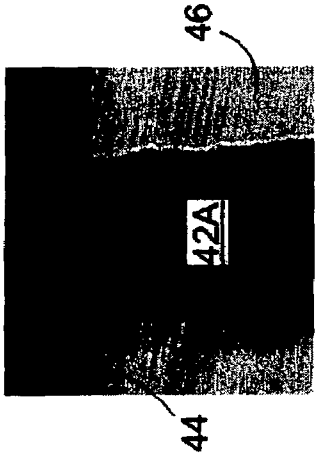
Figure 10A:
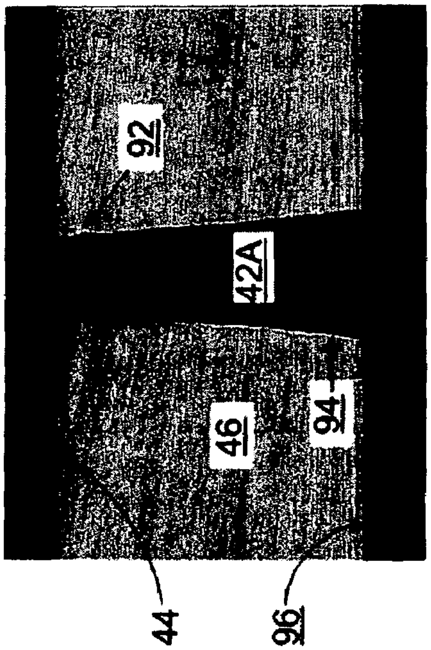
Figure 11:
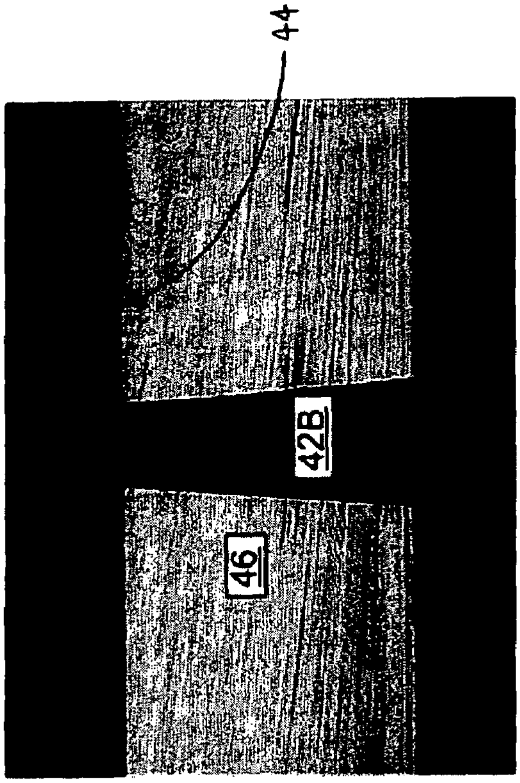
FIG. 11 is a photomicrograph of a substrate containing a fluid feed slot made by a process according to the disclosure.

FIGS. 10A–10C and 11 are photomicrographs of reentrant slots 42A made by a process (FIGS. 10A–10C) according to conventional thoughts and slots 42B made according to other exemplary embodiments of the disclosure. FIG. 10B is an enlarged photomicrograph of a portion of the substrate 46. FIG. 10C is an enlarged photomicrograph of FIG. 10B showing one side of the slot 42A near the device surface 44 of the substrate. FIG. 11 is a substrate having a reentrant slot 42B made in accordance with exemplary embodiments of the disclosure.

It is evident from the comparison of FIGS. 10A–10C with FIG. 11 that lowering the source power and lowering the etch chamber pressure in combination with the other parameters produced superior reentrant profiles with less device side damage than a process in line with conventional approaches.

It is possible to produce slots 42 having reentrant profiles without ramping up or down the various parameters listed in the above table. However, providing parameters which are selected at the outset and remain constant throughout the etching process, for example, may have negative effects on the overall etching process or resulting product. For example, processes with a lower constant etch pressure will tend to produce reentrant profiles at a lower etch rate and hence greater cycle time. On the other hand, if the pressure is initially high and is ramped down throughout the process, the negative effects on etch rate may be counteracted while providing pressures that enhance the reentrant profile as the depth of the etch progresses through the substrate 46.

Likewise, a high platen power, while tending to produce reentrant profiles at a constant rate, lowers to a great extent the etch selectivity between the substrate 46 and the etch mask 34. By choosing an initially lower platen power and ramping the power up throughout the process the detrimental effects of etch selectivity can be reduced without sacrificing the benefits achieved by proving a higher platen power as the etch depth through the substrate 46 progresses.

Accordingly, the source power according to the embodiments described herein may be ramped down beginning in a range of 2500 to about 3000 Watts to a range of from about 1500 to about 2000 Watts during the etching process. The chamber pressure may be decreased from an initial pressure ranging from about 100 to about 150 milliTorr to a pressure ranging from about 30 to about 60 milliTorr during the process. The platen power may be increased from an initial power ranging from about 150 to about 200 Watts to a power in the range of from about 200 to about 300 Watts.

In another embodiment, a process for improving a reentrant profile etched in a semiconductor substrate is provided. When dry etching semiconductor materials using a DRIE process, characteristic feature dimensions can be of significant functional importance. The formation of one desirable feature may be detrimental to the formation of another feature that is equally desirable. In many situations optimizing two such features results in the unfortunate dilemma whereby the process parameters to achieve the first desirable feature are opposite to the parameters used to achieve the second desirable feature.

For example, there appears to be an inverse relationship between the reentrant profile of a slot 42 formed in the substrate 46 and the amount of device side damage (FIG. 7). Reentrant slot profiles are desirable for improving fluid flow and delivery of fluid to the device side 44 of the substrate. Device side damage negatively affects shelf length control which may lead to cross talk between fluid chambers 60 (FIG. 5), low chip strength and performance variability. Plasma process parameters selected to achieve the desirable reentrant profiles often increase the device side damage. Small variations in the parameters of the etching process can have significant impact on the device side damage.

Furthermore, as the etching process through the substrate progresses, the process parameters selected to provide the reentrant profiles can also increase etch mask "erosion" rates. The longer the etch cycle, the greater the likelihood of increased device side damage to the substrate 46.

There are two exemplary methods for decreasing the etch cycle. One method involves changing the process parameters to speed up the etch rate. A second method involves reducing a thickness of the substrate so that the slot 42 is completed through the substrate in a shorter period of time compared to a thicker substrate being etched at the same etch rate. However, increasing the etch rate by increasing the source power and increasing the chamber pressure during the etching process reduces the reentrant profile of the slot 42 as described above.

Figure 12:
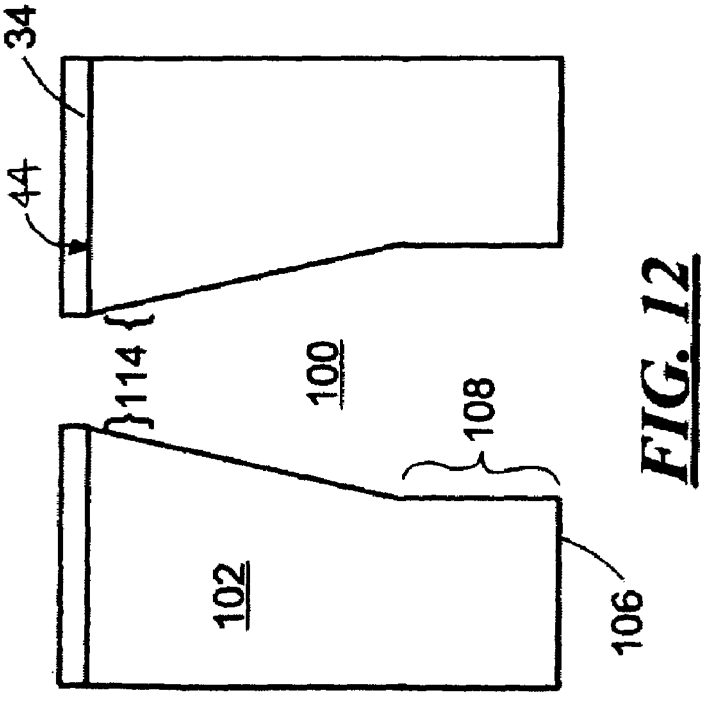
FIG. 12 is a cross-sectional view, not to scale, of another fluid feed slot made in a substrate having a conventional thickness.

Thus, in order to obtain a desired reentrant profile for the slot throughout the etch process, low initial values of the source power and chamber pressure can be used and decreased as the etch progresses through the substrate. As a result, the etch rate, which decreases as the etch progresses due to aspect ratio dependent effects, can be even further reduced by the continued reduction of the source power and chamber pressure throughout the etch process. A continued reduction in pressure and source power (and a continued increase in platen power) provides a bottle-shaped profile of a slot 100 in a substrate 102 as shown in FIG. 12. In current designs, such a bottle-shaped profile is fluidically undesirable for air bubble mobility through the slot 100.

Accordingly, decreasing the substrate thickness may provide superior results without using etching parameters that promote device side damage. For instance, if the etching process described above is used to etch slots 100 in a substrate 102 that is thinned from a backside 106 thereof in an amount equal to or greater than vertical portions 108 of the slot 100, a substrate 110 as shown in FIG. 13 having a slot 112 with a desired reentrant profile may be produced.

While reentrant profiles for slots 100 becomes more difficult to achieve as the etch progresses deeper into the substrate 102, it is also difficult to protect the upper previously etched side wall portions 114 from side wall damage and hence loss of reentrancy as the etch progresses through the substrate 102. Side wall damage of the wall portions 114, illustrated in FIGS. 10A–10C as item 92, may occur as a result of continued increase in ion kinetic energy as described above and beveling of the mask 34, which allows highly angled ion trajectories access to the wall portions 114 as the etch progresses.

Initially, ion trajectories are inhibited from reaching the side wall portions 114 by the etch mask 34 used to define the slot 100 location. As the etch continues however, the mask 34 becomes beveled by the accumulated ion bombardment and at some critical point is no longer able to disallow highly energetic ions from reaching the wall portions 114. As a result, the wall portions 114 begin to lose their attenuation, often times bowing out to become near vertical as shown by wall portions 92 in FIG. 10C. As is evident by the foregoing photomicrographs, the wall portions 94 near the backside 96 of the substrate (FIG. 10A) are consistently more reentrant than the wall portions 92 near the device surface 44 of the substrate 46.

Figure 13:
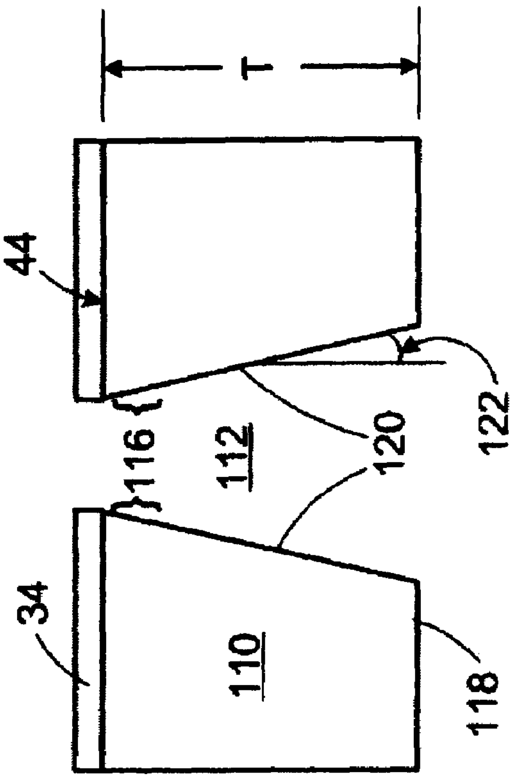
FIG. 13 is a cross-sectional view, not to scale, of a fluid feed slot made by another embodiment of the disclosure.

Accordingly, by reducing the thickness T of the substrate 110 as shown in FIG. 13, a desired reentrant slot 112 may be made through the thickness of the substrate 110 with reduced device side damage and reduced loss of reentrancy for the side wall portions 116 of the slot 112. A thinned substrate 110 according to the disclosure may have a thickness T ranging from about 200 to about 450 microns, as opposed to a conventional thickness of the substrate 102 ranging from about 500 to about 700 microns. One method for thinning a substrate 110 prior to etching is by mechanically grinding the backside 118 of the substrate 110 prior to etching the fluid slots 112 in the substrate 110.

An added benefit of backside mechanical grinding is that the process may remove impurities and other substances that may have been deposited on the backside surface 118 during deposition of layers on the device side 44 of the substrate 110. Many of these impurities may act as etch stop materials for the etching process for the slot 112 and thus may interfere with completion of the slot 112 through the substrate 110. While methods such as wet or dry etching the backside 118 of the substrate 110 may remove these impurities, backside wafer grinding is believed to be a superior method for removing such impurities. Methods of grinding wafers are described for example, in U.S. Pat. No. 5,268,065 to Grupen-Shemansky; U.S. Pat. No. 5,693,182 to Mathuni; and U.S. Publication No. 2003/0224583 to Change et al., the disclosures of which are incorporated herein by reference.

The resulting substrates 110 having slots 112 with reentrant profiles as shown in FIG. 13 preferably have side walls 120 substantially devoid of vertical portions 108. In an exemplary embodiment, the side walls 120 may have wall angles 122 measured from a vertical axis through the slot 112 ranging from about 2 to about 12°, and, in one embodiment, from about 4 to about 5°. In current ink jet heater chip designs to be used in products planned to be offered by Lexmark International, Inc., such wall angles appear to be particularly conducive to fluidic requirements associated with the same.

It is contemplated, and will be apparent to those skilled in the art from the preceding description and the accompanying drawings, that modifications and changes may be made in the embodiments of the disclosure. Accordingly, it is expressly intended that the foregoing description and the accompanying drawings are illustrative of exemplary embodiments only, not limiting thereto, and that the true spirit and scope of the present disclosure be determined by reference to the appended claims.

What is claimed is:

1. A method of micro-machining a substrate to form a through slot therein, the method comprising:

performing an etching cycle of a dry etch process for a substrate held by a platen of a dry etching chamber and, during the etching cycle, decreasing a source power, decreasing a chamber pressure from a first pressure to a second pressure, and increasing a platen power from a first power to a second power, whereby one or more through slots having a reentrant profile are formed in the substrate.

2. The method of claim 1, farther comprising increasing the platen temperature from below about −19° C. to at least about 20° C.

3. The method of claim 1, wherein a dry etching plasma for the etching process is derived from a silicon etching source.

4. The method of claim 3, wherein the silicon etching source comprises sulfur hexafluoride.

5. The method of claim 1, wherein the source power is decreased during the dry etch process from about 2500 Watts to about 2000 Watts.

6. The method of claim 5, wherein the first power ranges from about 150 to about 200 Watts and wherein the second power ranges from about 200 to about 300 Watts.

7. The method of claim 6, wherein the first pressure ranges from about 100 to about 150 milliTorr and the second pressure ranges from about 30 to about 60 milliTorr.

8. The method of claim 7, farther comprising increasing the platen temperature from below about −19° C. to at least about 20° C.

9. In a deep reactive ion etching process for etching a substrate to form one or more reentrant fluid flow slots therein, the improvement comprising:

decreasing a source power during etching cycle steps of the etching process;

decreasing a chamber pressure from a first pressure to a second pressure during etching cycle steps of the etching process; and increasing a platen power from a first power to a second power during etching cycle steps of the process.

10. The improvement of claim 9, further comprising increasing a platen temperature during at least passivating cycle steps of the etching process from a first temperature to a second temperature.

11. The improvement of claim 9, wherein the source power is decreased from about 2500 Watts to about 2000 Watts.

12. The improvement of claim 9, further comprising increasing the platen temperature from below about −19° C. to at least about 20° C.

13. The improvement of claim 9, wherein a deep reactive ion etching plasma is derived from a silicon etching source.

14. The improvement of claim 13, wherein the silicon etching source comprises sulfur hexafluoride.

15. The improvement of claim 9, further comprising mechanically thinning the substrate to provide a substrate having a thickness ranging from about 200 to about 450 microns.

16. The improvement of claim 15, wherein the substrate is thinned by grinding a backside surface area of the substrate.

* * * * *